(12) United States Patent
Jha et al.

(10) Patent No.: US 9,331,159 B1
(45) Date of Patent: May 3, 2016

(54) FABRICATING TRANSISTOR(S) WITH RAISED ACTIVE REGIONS HAVING ANGLED UPPER SURFACES

(71) Applicant: GLOBALFOUNDRIES Inc., Grand Cayman, KY (US)

(72) Inventors: Ashish Kumar Jha, Saratoga Springs, NY (US); Yan Ping Shen, Saratoga Springs, NY (US); Wei Hua Tong, Mechanicville, NY (US); Haiting Wang, Clifton Park, NY (US); Min-Hwa Chi, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/615,470

(22) Filed: Feb. 6, 2015

(51) Int. Cl.
| | |
|---|---|
| H01L 21/336 | (2006.01) |
| H01L 21/8234 | (2006.01) |
| H01L 29/417 | (2006.01) |
| H01L 29/66 | (2006.01) |
| H01L 21/311 | (2006.01) |
| H01L 21/306 | (2006.01) |
| H01L 21/02 | (2006.01) |
| H01L 29/04 | (2006.01) |
| H01L 29/08 | (2006.01) |
| H01L 29/78 | (2006.01) |

(52) U.S. Cl.
CPC .... *H01L 29/41783* (2013.01); *H01L 21/02233* (2013.01); *H01L 21/30604* (2013.01); *H01L 21/31111* (2013.01); *H01L 29/045* (2013.01); *H01L 29/0847* (2013.01); *H01L 29/6653* (2013.01); *H01L 29/66568* (2013.01); *H01L 29/78* (2013.01)

(58) Field of Classification Search
CPC .............. H01L 27/1104; H01L 29/435; H01L 51/0508; H01L 27/0924; H01L 29/7831; H01L 21/02241; H01L 21/8238; H01L 21/3141; H01L 21/67075; H01L 21/67069; H01L 21/02579; H01L 21/02576; H01L 21/02129; H01L 21/0245; H01L 21/3144
USPC ......... 438/197, 199, 680, 706, 745, 663, 786; 257/288, 350, E21.006, E21.014, 257/E21.051, E21.056, E21/077, E21.126, 257/E21.127, E1.17, E21.229, E21.267, 257/E21.278, E21.293, E21.319, E21.32, 257/E21.435
See application file for complete search history.

(56) References Cited

U.S. PATENT DOCUMENTS

| | | | |
|---|---|---|---|
| 8,354,320 B1 * | 1/2013 | Xie ................... | H01L 29/66795 438/279 |
| 9,111,962 B1 * | 8/2015 | Alptekin .......... | H01L 29/66795 |
| 2015/0076607 A1 * | 3/2015 | Alptekin ............... | H01L 29/785 257/365 |
| 2015/0079751 A1 * | 3/2015 | Alptekin ........... | H01L 29/66795 438/283 |
| 2015/0200276 A1 * | 7/2015 | Cheng ............... | H01L 29/66818 257/401 |

* cited by examiner

*Primary Examiner* — David Nhu
(74) *Attorney, Agent, or Firm* — Heslin Rothenberg Farley and Mesiti PC; Nicholas Mesiti

(57) ABSTRACT

Methods of fabricating transistors having raised active region(s) with at least partially angled upper surfaces are provided. The method includes, for instance: providing a gate structure disposed over a substrate, the gate structure including a conformal spacer layer; forming a raised active region adjoining a sidewall of the conformal spacer layer; providing a protective material over the raised active region; selectively etching-back the sidewall of the conformal spacer layer, exposing a side portion of the raised active region below the protective material; and etching the exposed side portion of the raised active region to partially undercut the protective material, wherein the etching facilitates defining, at least in part, an at least partially angled upper surface of the raised active region of the transistor.

20 Claims, 4 Drawing Sheets

FABRICATING TRANSISTOR(S) WITH RAISED ACTIVE REGIONS HAVING ANGLED UPPER SURFACES

BACKGROUND

Complementary metal-oxide-semiconductor (CMOS) technology continues to be an important technology for the fabrication of integrated circuits. In CMOS technology, both p-type devices, such as p-type field-effect transistors, and n-type devices, such as, n-type field effect transistors, are fabricated on a common semiconductor wafer.

As described by Moore's Law, the semiconductor industry drives down pattern dimensions in order to reduce transistor size and enhance processor speed at a rapid pace. Further enhancements in transistor designs and fabrication methods therefor continue to be pursued, for enhanced performance and commercial advantage.

BRIEF SUMMARY

The shortcomings of the prior art are overcome and additional advantages are provided through the provision, in one aspect, of a method for fabricating a transistor which includes, for instance: providing a gate structure disposed over a substrate, the gate structure including a conformal spacer layer; forming a raised active region adjoining a sidewall of the conformal spacer layer; providing a protective material over the raised active region; selectively etching-back the sidewall of the conformal spacer layer, exposing a side portion of the raised active region below the protective material; and etching the exposed side portion of the raised active region to partially undercut the protective material, wherein the etching facilitates defining, at least in part, an at least partially angled upper surface of the raised active region of the transistor.

In a further aspect, a structure is provided which includes a transistor, the transistor including: a gate structure disposed over a substrate; and a raised active region extending, at least in part, from the substrate, the raised active region being spaced from the gate structure, and having an upper surface that is angled relative to the substrate, with at least one vertex.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
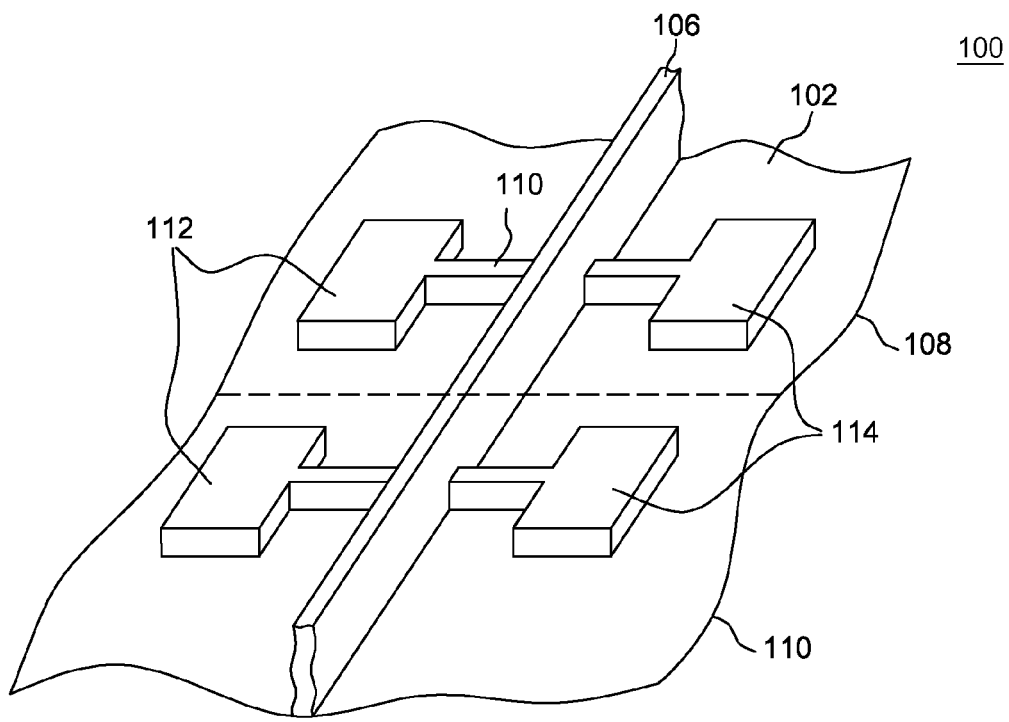
FIG. 1A is an isometric view of one embodiment of a transistor, in accordance with one or more aspects of the present invention.

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

Disclosed herein, in part, is a method of fabricating semiconductor devices including field-effect transistors (FETs) having a raised source region(s) or a raised drain region(s) with one or more partially angled upper surface(s). In one aspect, modern integrated circuit designs relying on complementary metal-oxide semiconductor (CMOS) technology may utilize both n-type FETs (NFETs) and p-type FETs (PFETs) having raised source and drain regions (collectively referred to herein as raised active regions) to enhance device performance. By way of example, the raised active regions may be formed abutting a conformal spacer layer of a gate structure by selectively epitaxially growing a semiconductor material over a semiconductor substrate. Further, depending on the application, the raised active regions may optionally be doped with dopants such as, n-type dopants and/or p-type dopants to modify the electrical properties of the semiconductor material of the raised active regions.

As size of technology nodes continues to decrease, protecting the raised active regions during various subsequent etching and cleaning processes typically can be an issue. For instance, the raised active regions of NFET devices which are doped with n-type dopants such as, phosphorus, may be susceptible to etchants such as, hot phosphoric acid employed during the forming of sidewall spacers along sidewalls of the gate structure. In particular, the sidewall spacers may be formed by etching a conformal spacer layer using, for instance, hot phosphoric acid. Disadvantageously, such hot phosphoric acid etching of the conformal spacer layer may also result in recessing of the raised active regions of the NFET devices, leading to variations in the heights of the raised active regions. It should be noted that, the raised active regions of the PFET devices (typically with p-type dopants)

are resistant to a hot phosphoric acid etching process, potentially resulting in lack of planarity across the wafer. This lack of planarity or uniformity of the raised active regions between different devices, such as between NFET and PEFT devices, can potentially negatively impact overall performance and/or yield of the integrated circuits.

Furthermore, as semiconductor devices, such as transistors are scaled down through various technology nodes, further enhancements in shape and surface geometry of raised active regions is of particular interest, as these properties may further enhance transistor device performance.

Advantageously, the present disclosure provides techniques for fabricating semiconductor devices such as, transistors having raised active regions with facets that are angled relative to a substrate structure, and which may have one or more vertices, while also achieving uniform active region heights across NFET and PFET devices. The methods and structures disclosed herein advantageously restrict damage during subsequent processing steps such as silicide formation, while increasing resultant contact surface area, enabling enhanced source and drain contacts. In addition, raised active regions with angled upper surfaces can lower contact resistance as well reduce capacitance, such as fringe capacitance between the raised active regions and the gate structure of the transistor.

Generally stated, disclosed herein, in one aspect, is a method for fabricating a transistor. The fabricating includes, for instance, providing a gate structure disposed over a substrate, the gate structure including a conformal spacer layer; forming a raised active region adjoining a sidewall of the conformal spacer layer; providing a protective material over the raised active region; selectively etching-back the sidewall of the conformal spacer layer, exposing a side portion of the raised active region below the protective material; and etching the exposed side portion of the raised active region to partially undercut the protective material, wherein the etching facilitates defining, at least in part, an at least partially angled upper surface of the raised active region of the transistor.

By way of example, the selectively etching-back includes isotropically etching, at least in part, the conformal spacer layer. For instance, the selectively etching-back of the sidewall may be controlled to leave a sidewall thickness "T" for the conformal spacer layer of the gate structure. In one embodiment, the raised active region may include, for instance, an n-type raised active region extending, at least in part, from the substrate, with the n-type raised active region being susceptible to a nitride etching process, and the selectively etching-back may include selectively etching the conformal spacer layer employing an etchant selective to a nitride material. In one example, the etchant may be or include a phosphorus-containing etchant such as, for instance, hot phosphoric acid ($H_3PO_4$) having a concentration of about 85 to 90% phosphoric acid which may be maintained at a temperature of about 150 to 165° C.

In one aspect, the raised active region may include at least one of a raised source region or a raised drain region, and the etching may include anisotropically etching the exposed side portion of the raised active region to partially undercut the protective material, with the anisotropically etching revealing a (111) crystallographic surface of the raised active region being oriented at an angle relative to the substrate. In one example, the anisotropically etching may be or include anisotropic wet etch processes. By way of example, the etching may include etching the raised active region employing a wet etchant that facilitates etching of silicon-based material. In one example, the wet etchant may be or include a hydroxide-containing etchant such as, for instance, ammonium hydroxide ($NH_4OH$) or tetramethyl ammonium hydroxide (TMAH).

In one embodiment, the raised active region may include at least one of an n-type raised active region or a p-type raised active region, and providing the protective material may include subjecting exposed surfaces of the raised active region to an oxygen plasma to form a protective material layer conformally over the exposed surfaces of the raised active region. In one example, the protective material may include or be fabricated of an oxide material, and may have a thickness within a range of about 1 to 1.5 nm. In another embodiment, providing the protective material may also include subjecting the raised active region to an oxidation process to form the protective material conformally over exposed surfaces of the raised active region.

In further embodiment, the fabricating method may also include removing the protective material disposed over the raised active region, subsequent to the etching of the exposed side portion of the raised active region. By way of example, the exposed side portion may be a first exposed side of the raised active region, and the etching may further include etching a second exposed side of the raised active region. The first and the second exposed sides may be etched employing a wet etchant that facilitates etching of silicon-based material. In such an example, the etchant may be or include a hydroxide-containing etchant such as, for instance, ammonium hydroxide ($NH_4OH$) or tetramethylammonium hydroxide (TMAH).

Further, the exposed side portion may include at least one of a (100) or a (110) crystallographic surfaces of the raised active region, and the etching (e.g., wet etching) may further include etching the at least one of the (100) or the (110) crystallographic surfaces to reveal one or more (111) crystallographic surfaces of the raised active region oriented at one or more angles relative to the substrate. In one embodiment, at least two (111) crystallographic surfaces of the one or more (111) crystallographic surfaces may converge to form one or more vertices of the at least partially angled upper surface of the raised active region. By way of example, the protective material may include or be fabricated of an oxide material, the active region may include or be fabricated of at least one of an n-type raised active region, for instance, phosphorus-doped silicon (SiP) material, or a p-type raised active region, for instance, silicon germanium (SiGe) material, and the conformal spacer layer may include or be fabricated of a nitride material such as, for instance, silicon nitride (SiN).

In another aspect, a structure is disclosed which includes a transistor, such as a field-effect transistor (FET), with a gate structure disposed over a substrate, and a raised active region extending, at least in part, from the substrate, the raised active region being spaced from the gate structure, and having an upper surface that is angled relative to the substrate, with at least one vertex.

Reference is made below to the drawings, which are not necessarily drawn to scale for ease of understanding, wherein the same reference numbers used throughout different figures designate the same or similar components.

By way of example, FIGS. 1A-1I depict one example of a process for facilitating defining, for instance, a partially angled upper surface(s) of one or more raised active regions for use, for instance, with transistor fabrication processing, in accordance with one or more aspects of the present invention.

Referring to FIG. 1A, one embodiment of a structure 100 having two field-effect transistors (FETs) is illustrated to provide overall context regarding the present invention. As illustrated, a portion of gate structure 106 may extend from a first FET in first region 108 to a second FET in second region 110, and each FET may include one or more fins 104. In a typical integrated circuit, thousands, millions, or more FETs may be interconnected. In complementary metal-oxide-semiconductor (CMOS) technology, n-type FETs (NFETs) may be interconnected with p-type FETs (PFETs), for example, by sharing a common gate structure, or may be connected by metal contacts (not shown). Each FET may include, for instance, any number of fins, depending on the desired circuit design. Note that utilizing more than one fin may allow a FET to accommodate a greater current from source 112 to drain 114. Also note that, for a given integrated circuit, there may be a variety of FETs utilizing varying number of fins interspersed throughout the integrated circuit.

Figure 1B:
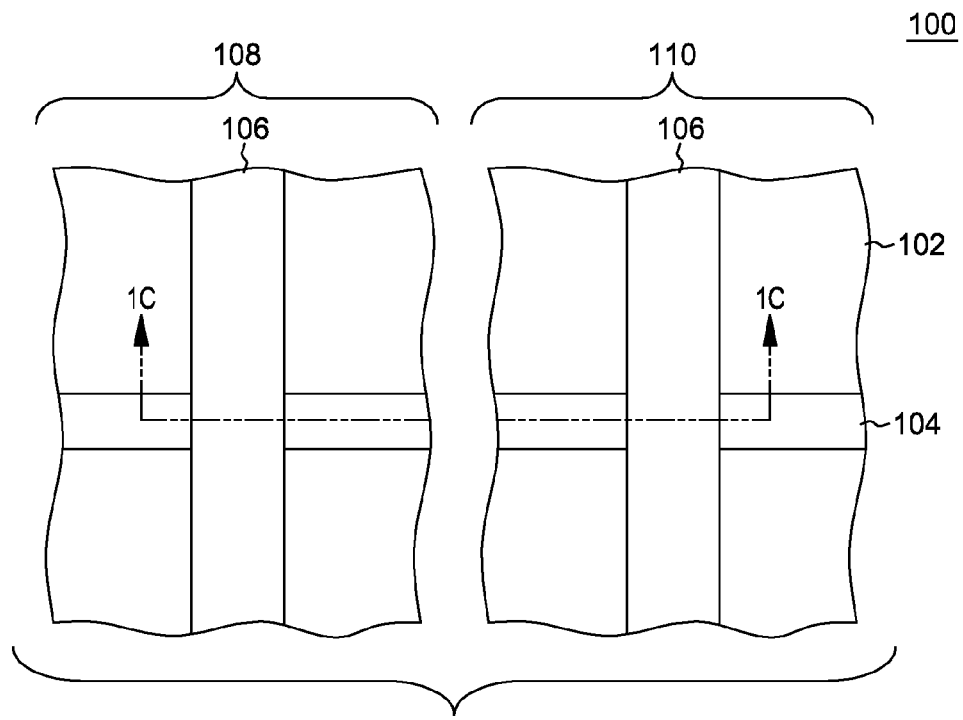
FIG. 1B is a plan view of one embodiment of a structure obtained during a transistor fabrication process, in accordance with one or more aspects of the present invention

FIG. 1B illustrates one example of a structure 100 obtained during transistor fabrication process. As shown, structure 100 includes one or more gate structures 106 disposed over a substrate 102. In the example depicted, one or more fins 104 are disposed over substrate 102 and support formation of fin-type field effect transistors (FinFETs). Gate structures 106 may extend conformally over (and partially wrap around) one or more fins 104. In one example, a replacement gate (RMG) process may be employed, wherein a sacrificial gate of an appropriate material, such as polycrystalline silicon (polysilicon), may be provided at an early stage of circuit fabrication, and then later removed and replaced with a final gate structure. In another example, the gate structure may be formed directly without the use of a sacrificial gate. Thus, the gate structure may be formed either before (gate-first) or after (gate-last) the formation of source regions and drain regions of the field-effect transistors, depending upon the process flow selected.

By way of example, substrate 102 may be a bulk semiconductor material such as a bulk silicon wafer. As another example, substrate 102 may include any silicon-containing substrate including, but not limited to, silicon (Si), single crystal Si, polycrystalline Si, amorphous Si, Si-on-nothing (SON), Si-on-insulator (SOI), or Si-on replacement insulator (SRI) substrate and the like, and may be n-type or p-type doped as desired for a particular application.

Fins 104 may extend from substrate 102, and may include one or more fins in a first region 108 and one or more fins in a second region 110. By way of example, first region 108 may comprise a p-type field-effect transistor (PFET) region and second region 110 an n-type field-effect transistor (NFET) region. Although not relevant to the present invention, the fins may be formed using any of the conventional fabrication processes by removing one or more portions of the substrate to create the fins from the same material as the substrate, such as, for example, a semiconductor or crystalline material.

Figure 1C:
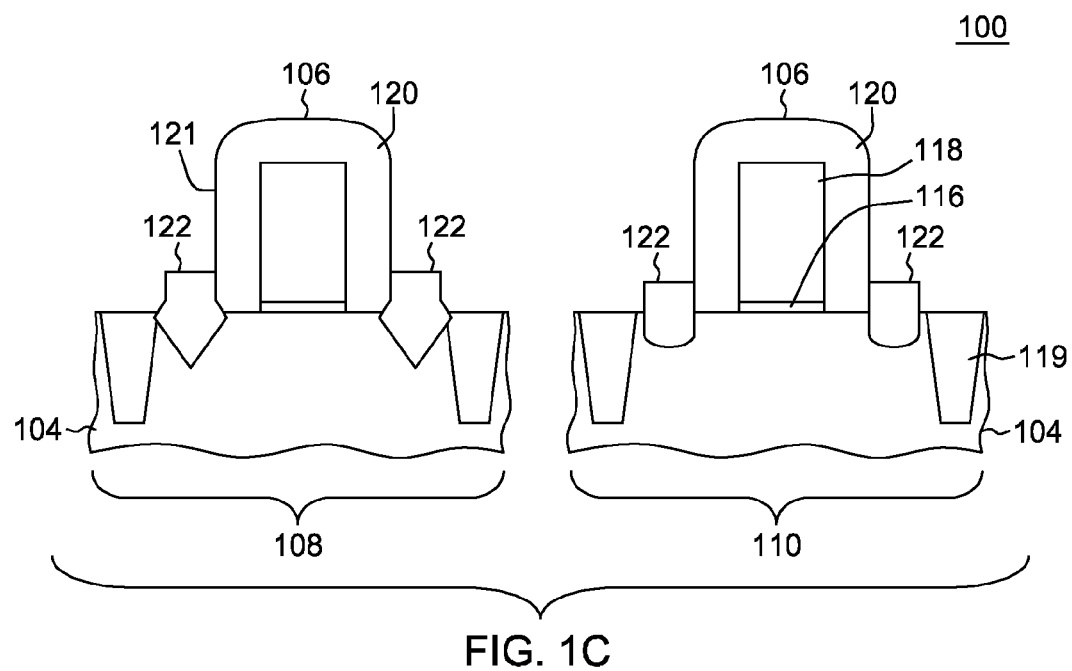
FIG. 1C is a cross-sectional elevation view of the structure of FIG. 1B, taken along 1C-1C thereof, and illustrating a substrate including a raised active region adjoining a conformal spacer layer of a gate structure, in accordance with one or more aspects of the present invention.

FIG. 1C illustrates a cross-sectional elevation view of the structure of FIG. 1B, taken along line 1C-1C thereof, after further processing. As shown, structure 100 includes fin(s) 104 extending between first region 108 and second region 110. By way of example, first region 108 may comprise a p-type field-effect transistor (PFET) region and second region 110 an n-type field-effect transistor (NFET) region. Note also that in one example, first region 108 may be electrically isolated from second region 110 by one or more isolation barriers or layers 119. Isolation barriers or layers 119 which, in one example, may include or be fabricated of an insulator, for example, an oxide such as, silicon oxide or tetraethyl orthosilicate. As noted, structure 100 further includes one or more gate structures 106 disposed over fin(s) 104. Gate structure 106 can include a gate conductive material 118 disposed over a thin dielectric layer 116 (e.g., gate oxide), and have a conformal spacer layer 120 over the gate material. As discussed above, in one example, gate structure 106 may be formed using a replacement gate process, with gate material 118 being a sacrificial gate material designed to be subsequently replaced with a metal gate material. Conformal spacer layer 120 may be conformally provided over gate material 118, and may include or be fabricated of a nitride material (such as, for instance $Si_3N_4$ or SiN) or oxide material or a combination of both. Conformal spacer layer 120, in one example, may be deposited as one or more layers using a variety of techniques such as, for instance, chemical vapor deposition (CVD) or atomic layer deposition (ALD) or plasma-enhanced versions of the same.

As illustrated, structure 100 further includes one or more raised active region(s) 122, which include, for instance, a raised source region and a raised drain region, separated in part, by a channel region (for instance, shown as the fin portion beneath the gate structure between raised active regions 122). The channel region, for instance, may reside or include an upper portion of fin 104 below gate structure 106. By way of example, raised active region(s) 122 may be provided adjoining a sidewall 121 of conformal spacer layer 120 by forming cavities within the fin(s) 104 and then providing a semiconductor material within the cavities (not shown). For example, raised active region(s) 122 can be epitaxially formed, such as by growing a semiconductor material (e.g. silicon or silicon germanium) within the cavities long enough to allow the semiconductor material to partially extend from the fin(s) forming the raised active region(s). Assuming that first region 108 is a PFET region and second region 110 is an NFET region, then, in a specific example, the epitaxially grown semiconductor material may be or include a silicon germanium (SiGe) material for the PFET region, and a silicon material for the NFET region (by way of example only). It should be noted here that the semiconductor material (e.g., silicon or silicon germanium) may have the same crystallographic orientation(s) of fins 104, for instance, with surface bounded (100) or (110) orientations, and that the symbol (xyz) denotes the Miller index for a crystal plane. Further, the raised active region(s) may optionally be doped with dopants such as, n-type or p-type dopants to modify electrical properties of the semiconductor materials. For instance, silicon germanium material of raised active regions 122 within first region 108 may be doped with p-type dopants such as, boron, aluminum, gallium, or indium, while silicon material of raised active regions 122 within second region 110 may be doped with n-type dopants such as, phosphorus, antimony or arsenic.

Figure 1D:
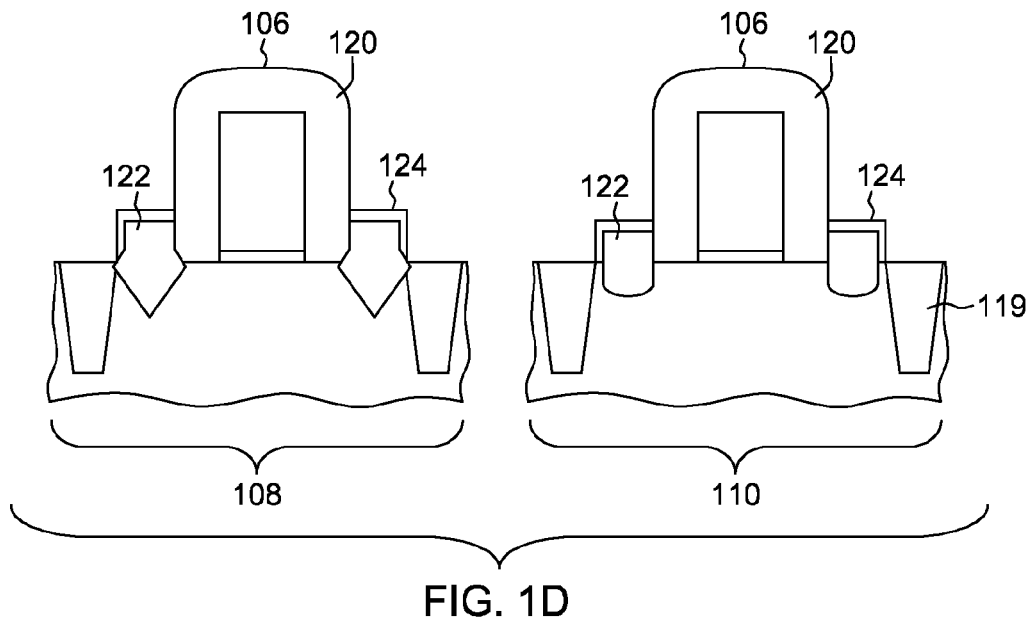
FIG. 1D depicts the structure of FIG. 1C after providing a protective material conformally over exposed surfaces of the raised active region, in accordance with one or more aspects of the present invention.

FIG. 1D depicts the structure of FIG. 1C after providing a protective material 124 conformally over raised active regions 122, in accordance with one or more aspects of the present invention. By way of example, protective material 124 may be formed by subjecting raised active regions 122 to one or more oxidation processes such as, rapid thermal oxidation (RTO) to form a layer of protective material 124 over exposed surfaces of raised active regions 122. For instance, upon exposure to an oxygen atmosphere, the semiconductor material (e.g., silicon or silicon germanium) of the raised active region tends to oxidize forming an oxide material such as, silicon oxide ($SiO_2$) over the exposed surfaces of the raised active regions 122. In another example, the exposed surfaces of raised active regions 122 may also be subjected to a remote plasma which may include, for instance, oxidizing plasma species to form the oxide protective material over the raised active regions 122. In one example, the oxidizing plasma species may include or be fabricated of an oxygen-containing process gas such as, for instance, oxygen ($O_2$), carbon dioxide ($CO_2$) or ozone ($O_3$). The protective material may have a thickness within a range of about 1 to 1.5 nm.

Figure 1E:
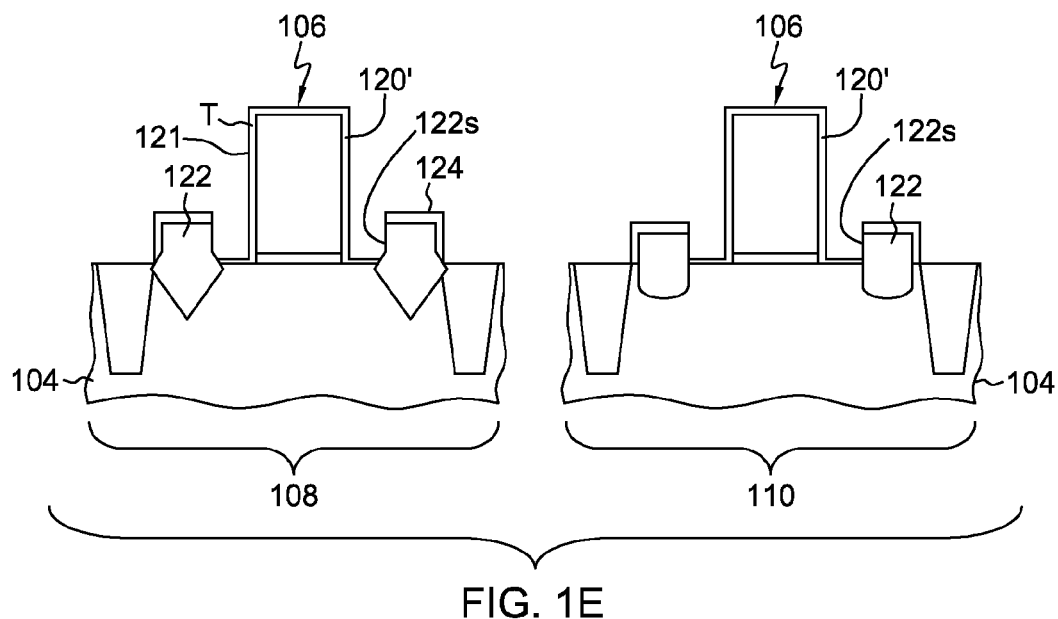
FIG. 1E depicts the structure of FIG. 1D after selectively etching-back the conformal spacer layer, in accordance with one or more aspects of the present invention.

FIG. 1E depicts the structure of FIG. 1D after selectively etching-back the conformal spacer layer to attain a reduced, conformal spacer layer 120', in accordance with one or more aspects of the present invention. In the depicted embodiment, sidewall 121 of the conformal spacer layer may be etched-back using an etching process that selectively etches the material of the conformal spacer layer, without affecting the raised active regions 122 and/or the protective material 124 disposed thereover. In one example, the selectively etching back may be accomplished by isotropically etching the conformal spacer layer using, for instance, phosphorus-containing etchant such as, hot phosphoric acid as an etchant. For instance, the hot phosphoric acid may have a concentration of about 85 to 90% phosphoric acid, and may be maintained at a temperature of about 150 to 165° C. As illustrated, the etching-back of sidewall 121 of conformal spacer layer 120' selectively exposes side portion(s) 122s of raised active regions 122. This side portion(s) 122s may have a (100) crystallographic or (110) crystallographic surface. Further, the isotropically etching-back sidewall 121 of conformal spacer layer 120' may be performed by controlling the process parameters such that a thin layer of conformal spacer layer 120' remains over gate structure 106. Assuming that raised active region 122 of second region 110 is doped with an n-type dopant, such as phosphorus, then by controlling the process parameters (e.g., etch time and etch rate), conformal spacer layer 120' may be selectively etched without etching raised active region 122 below protective material 124, while controlling thickness "T" of conformal spacer layer 120'. The thickness of resultant conformal spacer layer 120' may be within a range of about 1 to 2 nm, by way of example only.

Figure 1F:
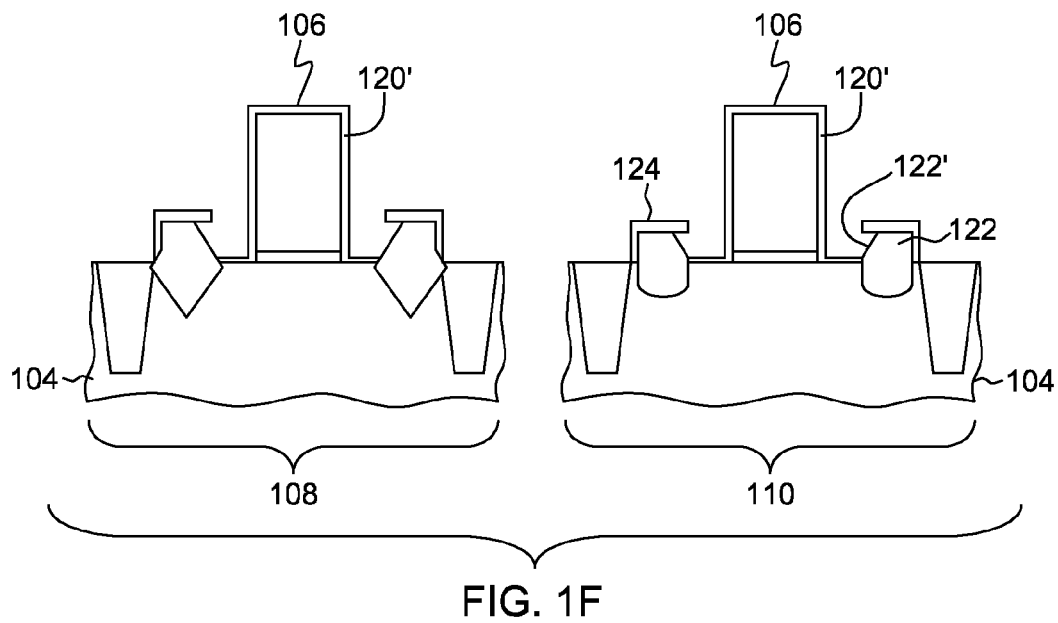
FIG. 1F depicts the structure of FIG. 1E after anisotropically wet etching an exposed side portion of the raised active region to form partially angled upper surfaces thereof, in accordance with one or more aspects of the present invention.

FIG. 1F depicts the structure of FIG. 1E after anisotropically etching exposed side portions 122s of raised active regions 122, in accordance with one or more aspects of the present invention. By way of example, the anisotropic etching of exposed side portion 122s of raised active regions 122 may be accomplished by employing an anisotropic wet etch process using, for instance, hydroxide-containing etchants such as, ammonium hydroxide (NH$_4$OH), potassium hydroxide (KOH), tetramethylammonium hydroxide (TMAH) or the like. Note that the anisotropic wet etchants may selectively etch an (100) crystallographic surface or an (110) crystallographic surface of exposed side portions 122s, revealing a (111) crystallographic surface of the raised active regions 122 that is oriented at an angle relative to fin(s) 104, of the substrate, thereby resulting in at least partially angled surface 122' thereof. As understood, the (111) crystallographic surface of the raised active regions 122 have a much slower etch rate or may remain substantially unetched compared to the (100) or (110) crystallographic surfaces, thereby self-limiting the etching distance below protective material 124 independent of time or other process parameters. Note that in this example, the (111) crystallographic surface of raised active regions 122 may be oriented at a characteristic angle, such as, an angle of about 54.7° relative to fin(s) 104 of the substrate. The partially angled (111) surface 122' of raised active regions 122 may be advantageous in reducing capacitance such as, fringe capacitance between raised active regions 122 and gate structure(s) 106 of a transistor, thereby enhancing device performance. Further, it may also be the case that the raised active regions of first region 108 and second region 110 may have significantly different etch rates to the anisotropic wet etch processes. In such an example, the anisotropic etching of the raised active regions 122 of first region 108 and second region 110 may be separately performed using additional lithographic masking processes.

Figure 1G:
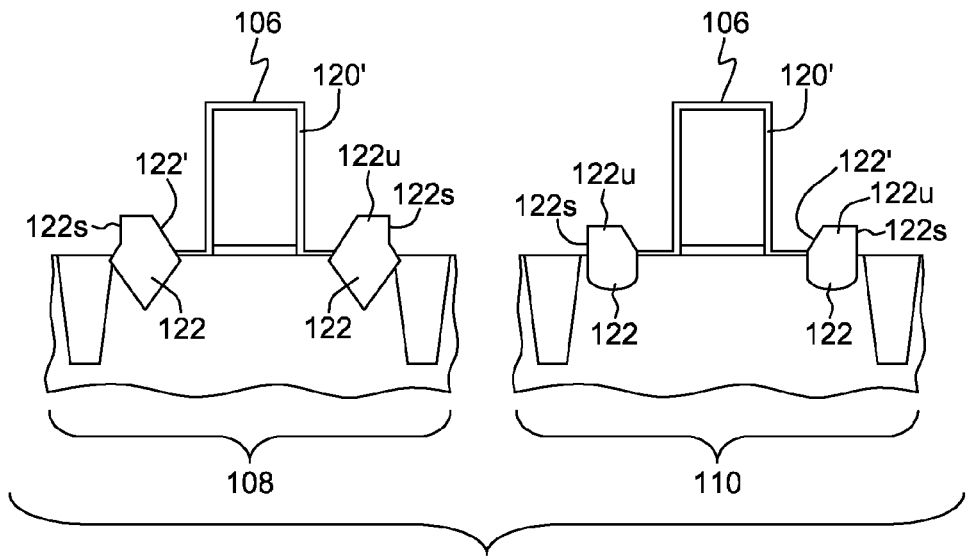
FIG. 1G depicts the structure of FIG. 1F after the removal of the protective material, in accordance with one or more aspects of the present invention.

FIG. 1G depicts the structure of FIG. 1F after removal of protective material 124 (FIG. 1F). This may be accomplished via one or more 1 anisotropic, dry-etch processes such as, oxygen strip or plasma etch processing to expose additional side portions 122s as well as upper surfaces 122u of raised active regions 122. Note that, the etch processes employed are selective to oxide removal processes without affecting conformal spacer layer 120' of gate structure(s) 106 and partially angled (111) surfaces 122' of raised active regions 122.

Figure 1H:
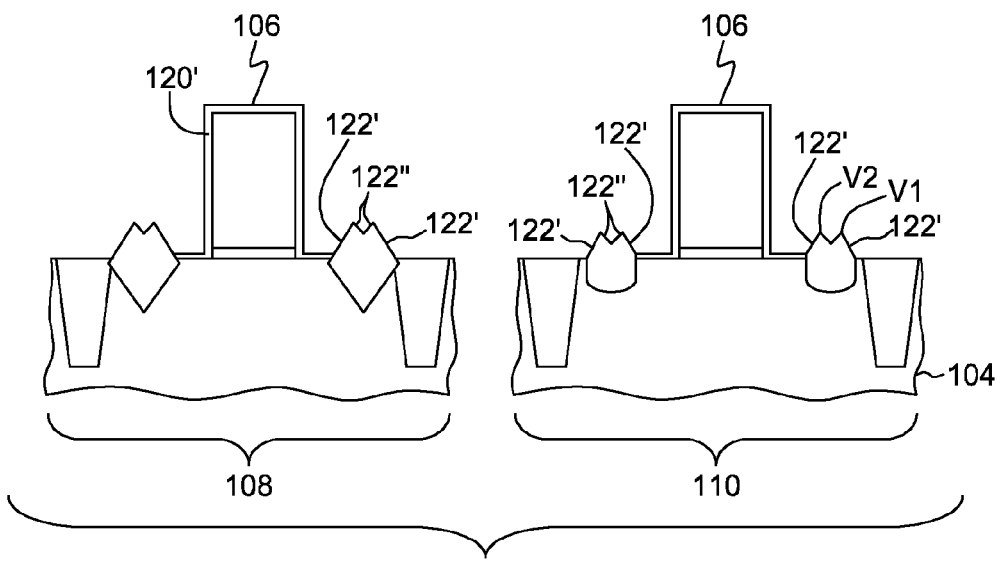
FIG. 1H depicts the structure of FIG. 1G after anisotropically wet etching the exposed side portion of the raised active region to form additional partially angled upper surface(s) thereof, in accordance with one or more aspects of the present invention.

FIG. 1H depicts the structure of FIG. 1G after anisotropically etching exposed side portions 122s of raised active regions 122, in accordance with one or more aspects of the present invention. The etching of exposed side portions 122s may be accomplished by, for instance, anisotropic wet etch processing using hydroxide-containing etchants such as, ammonium hydroxide (NH$_4$OH), potassium hydroxide (KOH) or tetramethylammonium hydroxide (TMAH), as described in connection with FIG. 1F. As depicted and described above, the anisotropic wet etchants may selectively etch (100) crystallographic surfaces or (110) crystallographic surfaces of exposed side portions 122s to reveal (111) crystallographic surfaces of raised active regions 122. These (111) crystallographic surfaces of raised active regions 122 are oriented at an angle, such as, an angle of about 54.7° relative to fin(s) 104 of the substrate resulting in additional partially angled surfaces 122' thereof, as shown in FIG. 1H.

Further, it may be the case that exposed upper surfaces 122u of raised active regions 122 may also have a (100) crystallographic surface or a (110) crystallographic surface. Upon exposure to anisotropic wet etchants, exposed upper surfaces 122u of raised active regions 122 may thus also be preferentially etched to reveal one or more further (111) crystallographic surfaces 122" at the upper surfaces thereof, thereby increasing or enhancing an upper surface area of raised active regions 122. Although a single anisotropic etch may attack one or more (100) or (110) crystallographic surfaces, one skilled in the art will know that separate anisotropic wet etch processes may optionally be performed to etch exposed upper surfaces 122u and exposed side portions 122s of raised active regions 122 to reveal one or more (111) crystallographic surfaces 122', 122" that are oriented at an angle relative to fin(s) 104. Further, as described above, these (111) crystallographic surfaces 122" of raised active regions 122 may be oriented at an angle of about 54.7° relative to fin(s) 104. It should be noted here that at least two such (111) crystallographic surfaces of raised active regions 122 may converge to form one or more vertices V1, V2 which advantageously are of substantially equal height. In the embodiment depicted, (111) crystallographic surfaces 122' and (111) crystallographic surfaces 122" may intersect to form a first vertex V1 and a second vertex V2. Advantageously, provision of (111) facetted surfaces 122" within raised active regions 122 may increase resultant surface area for silicide and contact structure fabrication during subsequent fabrication processing, while the (111) facetted surfaces 122' may reduce capacitance, such as fringe capacitance between contact raised active regions 122 and gate structure(s) 106 of the transistor, thereby enhancing overall device performance.

Advantageously, one skilled in art will note that, in one embodiment, subsequent gate-last fabrication processing may proceed which includes, for instance, removal of the reduced conformal spacer layer, forming sidewall spacers along sidewalls of the gate structure, deposition of isolation layers or the like, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    fabricating a transistor, the fabricating comprising:
        providing a gate structure disposed over a substrate, the gate structure including a conformal spacer layer;
        forming a raised active region adjoining a sidewall of the conformal spacer layer;
        providing a protective material over the raised active region;
        selectively etching-back the sidewall of the conformal spacer layer, exposing a side portion of the raised active region below the protective material; and
        etching the exposed side portion of the raised active region to partially undercut the protective material, wherein the etching facilitates defining, at least in part, an at least partially angled upper surface of the raised active region of the transistor.

2. The method of claim 1, wherein the selectively etching-back comprises isotropically etching, at least in part, the conformal spacer layer.

3. The method of claim 2, wherein the selectively etching-back of the sidewall is controlled to leave a sidewall thickness "T" for the conformal spacer layer of the gate structure.

4. The method of claim 2, wherein the raised active region comprises an n-type raised active region extending, at least in part, from the substrate, the n-type raised active region being susceptible to a nitride etching process, and the selectively etching-back comprises selectively etching the conformal spacer layer employing an etchant selective to a nitride material.

5. The method of claim 4, wherein the etchant comprises a phosphorus-containing etchant.

6. The method of claim 1, wherein the raised active region comprises at least one of a raised source region or a raised drain region, and the etching comprises anisotropically etching the exposed side portion of the raised active region to partially undercut the protective material, wherein the anisotropically etching reveals a (111) crystallographic surface of the raised active region that is oriented at an angle relative to the substrate structure.

7. The method of claim 6, wherein the etching comprises etching the raised active region employing an etchant that facilitates etching of silicon-based material, the etchant comprising a hydroxide-containing etchant.

8. The method of claim 1, wherein the raised active region comprises at least one of an n-type raised active region or a p-type raised active region, and providing the protective material comprises subjecting exposed surfaces of the raised active region to an oxygen plasma to form a protective material layer conformally over the exposed surfaces of the raised active region.

9. The method of claim 8, wherein the protective material comprises an oxide material, and has a thickness within a range of about 1 to 1.5 nm.

10. The method of claim 1, wherein providing the protective material comprises subjecting the raised active region to an oxidation process to form the protective material conformally over exposed surfaces of the raised active region.

11. The method of claim 1, further comprising removing the protective material disposed over the raised active region, subsequent to the etching of the exposed side portion of the raised active region.

12. The method of claim 11, wherein the exposed side portion is a first exposed side of the raised active region, and wherein the etching further comprises etching a second exposed side of the raised active region.

13. The method of claim 12, wherein the first and the second exposed sides are etched employing an etchant that facilitates etching of silicon-based material, the etchant comprising a hydroxide-containing etchant.

14. The method of claim 1, wherein the exposed side portion comprises at least one of a (100) or a (110) crystallographic surfaces of the raised active region, and the etching further comprises etching the at least one of the (100) or the (110) crystallographic surfaces to reveal a plurality of (111) crystallographic surfaces of the raised active region oriented at one or more angles relative to the substrate.

15. The method of claim 14, wherein at least two (111) crystallographic surfaces of the plurality of (111) crystallographic surfaces converge to form one or more vertices of the at least partially angled upper surface of the raised active region.

16. The method of claim 1, wherein the protective material comprises an oxide material, the active region comprises at least one of an n-type raised active region or a p-type raised active region, and the conformal spacer layer comprises a nitride material.

17. A structure comprising:
    a transistor, the transistor comprising:
        a gate structure disposed over a substrate; and
        a raised active region extending, at least in part, from the substrate, the raised active region being spaced from the gate structure, and having an upper surface that is angled relative to the substrate, with at least one vertex.

18. The structure of claim 17, wherein the upper surface of the raised active region comprises a plurality of (111) crystallographic surfaces, each oriented at an angle relative to the substrate.

19. The structure of claim 18, wherein the raised active region comprises at least two (111) crystallographic surfaces of the plurality of (111) crystallographic surfaces which converge to form the at least one vertex of the raised active region.

20. The structure of claim 17, wherein the raised active region comprises at least one of an n-type raised active region or a p-type raised active region.

\* \* \* \* \*